(12) United States Patent
Maeno et al.

(10) Patent No.: US 6,176,706 B1
(45) Date of Patent: Jan. 23, 2001

(54) SUBMINIATURE LAMP FOR INDICATION LIGHT

(75) Inventors: Shōzō Maeno, Fukushima; Daishin Sato; Katsuhito Yamaguchi, both of Yamagata, all of (JP)

(73) Assignee: Stanley Electric Co., Ltd., Tokyo (JP)

( * ) Notice: Under 35 U.S.C. 154(b), the term of this patent shall be extended for 0 days.

(21) Appl. No.: 09/383,144

(22) Filed: Aug. 26, 1999

(30) Foreign Application Priority Data

Aug. 28, 1998 (JP) ................................................. 10-243822

(51) Int. Cl.[7] .................................................... H01R 12/00
(52) U.S. Cl. .............................................. 439/56; 439/619
(58) Field of Search ............................... 439/56, 57, 619, 439/611, 617

(56) References Cited

U.S. PATENT DOCUMENTS

| 3,511,982 | * | 5/1970 | Salter | 439/57 |
| 4,193,653 | * | 3/1980 | Aizawa | 439/57 |
| 5,061,189 | * | 10/1991 | Iio et al. | 439/57 |
| 5,069,640 | | 12/1991 | Wasimoto et al. | 439/619 |
| 5,129,829 | * | 7/1992 | Arnold et al. | 439/56 |

FOREIGN PATENT DOCUMENTS

| 2-117656 | 9/1990 | (JP) . |
| 3-94763 | 9/1991 | (JP) . |
| 4-87158 | 7/1992 | (JP) . |

* cited by examiner

*Primary Examiner*—T. C. Patel
(74) *Attorney, Agent, or Firm*—Morgan, Lewis & Bockius LLP

(57) ABSTRACT

A subminiature lamp having a bulb with lead wires and a socket, the socket having a socket base and a bulb holder, connected to the socket base, for holding the bulb in a predetermined position, wherein a front surface and a back surface of the socket base form a substantially flat plate and are parallel with each other, the bulb holder is attached on the front surface of the socket base and the shape of the bulb holder is substantially a cylinder with a bottom corresponding to a portion of the front surface of the socket base, and a slit extends through the diameter of the bulb holder, and wherein the lead wires may be disposed along the front and back surfaces of the socket base and may extend through the slit of the bulb holder to contact the bulb in the bulb holder.

9 Claims, 2 Drawing Sheets

SUBMINIATURE LAMP FOR INDICATION LIGHT

This invention claims the benefit of Japanese Patent Application No. HEI 10-243822, filed on Aug. 28, 1998, which is hereby incorporated by reference.

BACKGROUND OF THE INVENTION

1. Field of the Invention

This invention relates to a subminiature lamp used as a signal or indicator for home appliances, audio-visual products and office equipment, or the like, and more particularly to a composition of a subminiature lamp that is used with a socket disposed on a printed wiring board by soldering, or the like.

2. Discussion of the Related Art

FIGS. 5 and 6 illustrate conventional subminiature lamps used as a signal or indicator. The subminiature lamp 90 in FIG. 5 is to be mounted from the back surface of a printed wiring board 20. This subminiature lamp 90 assembly has a bulb 91, a socket 92, and a pair of lead wires 91a penetrating through the socket 92. The socket 92 includes a bulb holder 93 which is formed as a cylinder with a bottom to maintain the bulb 91 within the cylinder, and also includes a socket base 94 to mount the subminiature lamp 90 on the printed wiring board 20.

The bulb 91 of the conventional lamp 90 in FIG. 5 is mounted in the bulb holder 93 in the socket 92 by pulling out the pair of lead wires 91a through holes in the bottom of the bulb holder 93 to the back surface of socket base 94. Each of the pair of lead wires 91a is wound around each end 95 of the socket base 94. Since the bulb 91 is installed by penetrating through the printed wiring board 20, the back surface of the printed wiring board 20 faces the front surface of the socket base 94. Accordingly, the front surface of the socket base 94 must be designed to satisfy this mounting requirement.

The subminiature lamp 80 in FIG. 6 is installed on the front surface of the printed wiring board 20. This subminiature lamp 80 assembly has a bulb 91, a socket 82, and a pair of lead wires 91a passing through the socket 82. The socket 82 includes a bulb holder 83 which is formed as a cylinder with a bottom to maintain the bulb 91 within the cylinder, and the socket base 84 to mount the subminiature lamp 80 on the printed wiring board 20. In this composition, since the subminiature lamp 80 is installed on the front surface of the printed wiring board 20, and therefore does not pass through the printed wiring board, the socket base 84 touches the front surface of the printed wiring board 20.

The conventional subminiature lamps 90 and 80 have at least the following two problems. First, the compositions of the subminiature lamps 90 and 80 are difficult to produce when mounted on the printed wiring board 20, because the lead wires 91a are very fine and must go through the socket bases 94 and 84 by passing through holes existing in the bottom portion of the bulb holders 93 and 83. Second, since there are differences with respect to how to mount the subminiature lamp 90 and 80 on the printed wiring board 20, even though the basic properties of the lamps are the same, two kinds of the subminiature lamps 90 and 80 are required depending on the mounting conditions designated by customers. This may often change the production plan and consequently lower productivity.

SUMMARY OF THE INVENTION

The present invention is directed to a subminiature lamp for indication that substantially obviates one or more of the above problems due to the limitations and disadvantages of the conventional lamps.

According to the present invention, the above objects are achieved by providing a subminiature lamp having a bulb with lead wires and a socket, the socket having a socket base and a bulb holder, connected to the socket base, for holding the bulb in a predetermined position, wherein a front surface and a back surface of the socket base form a substantially flat plate and are parallel with each other, the bulb holder is attached on the front surface of the socket base and the shape of the bulb holder is substantially a cylinder with a bottom corresponding to a portion of the front surface of the socket base, and a slit extends through the diameter of the bulb holder, and wherein the lead wires may extend through the slit of the bulb holder and may be disposed along the front and back surfaces of the socket base.

A further object of the invention is to provide a socket for a subminiature lamp, comprising a socket base having a top surface and a bottom surface, and at least one surface of the socket base is capable of attachment to an object; a bulb holder, connected to the socket base, for holding a bulb in a predetermined position, the bulb holder having at least one opening in a side portion of the bulb holder; and at least one lead wire having a portion disposed along at least one surface of the socket base and extending through the at least one opening in the bulb holder to contact a bulb in the bulb holder.

BRIEF DESCRIPTION OF THE DRAWINGS

The accompanying drawings, which are included to provide a further understanding of the invention, illustrate embodiments of the invention and together with the description serve to describer the principles of the invention.

DETAILED DESCRIPTION OF THE PREFERRED EMBODIMENTS

The preferred embodiments of the present invention will be described with reference to the drawings.

Figure 1:
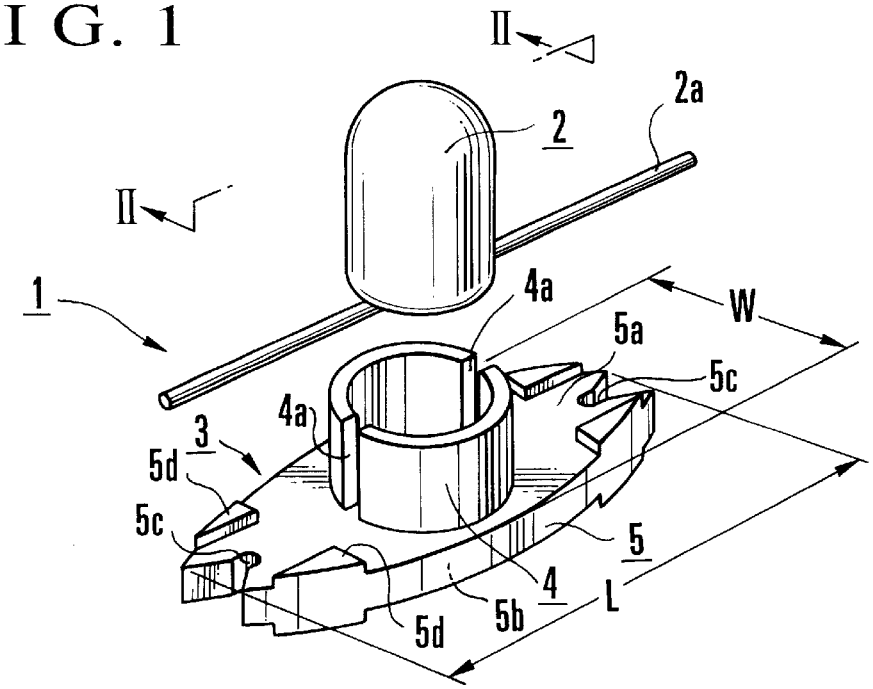
FIG. 1 is a perspective view of the first preferred embodiment of the present invention.
Figure 2:
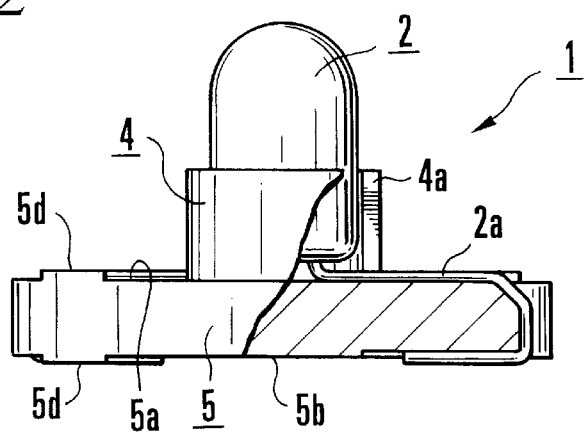
FIG. 2 is a partly cross-sectional view along the II—II line of the first preferred embodiment of the present invention.

The subminiature lamp 1 in FIGS. 1 and 2 comprises, similar to a conventional subminiature lamp, a bulb 2 with lead wires 2a and a socket 3. The socket 3 comprises a substantially cylindrical bulb holder 4 and a socket base 5.

In this embodiment, the bulb holder 4 is disposed to be a cylinder with a bottom which is a portion of one surface 5a of the socket base 5, wherein a slit 4a is formed along a diameter of the cylinder. The slit 4a also extends, in height direction, from one end on the side of a top portion of the bulb holder 4, to the one surface 5a of the socket base 5. The bulb 2 is disposed within an internal diameter of the bulb holder 4.

The socket base 5 is formed to be a rectangular or elliptical plate, or the like, whose longitudinal length L is longer than the width W. The top surface 5a and the bottom surface 5b are parallel with each other. The slit 4a extends along the longitudinal length L.

A guide ditch 5c is formed on both ends of the socket base 5 in the direction of the longitudinal length L to introduce a lead wire 2a of the bulb 2 from the top surface 5a to the bottom surface 5b. This guide ditch 5c may reach the bottom surface 5b, if necessary. For example, this guide ditch 5c may extend from the top surface 5a through the plate 5 to the bottom surface 5b in order to form a return passage of the lead wire 2a.

In addition, the socket base 5 further comprises projections 5d, formed on both ends in the width direction, between which the lead wire 2a passes through. The height of the projections 5d is substantially the same as a projected portion of the lead wire 2a when disposed on the surfaces 5a and 5b of socket base 5. In this embodiment, there are two lead wires and each lead wire is respectively installed from the top surface 5a to the bottom surface 5b passing between the facing projections 5d. Accordingly, four projections may be formed on only one surface 5a or 5b, or eight projections may be formed on both surfaces 5a and 5b.

Since the bulb holder 4 has the slit 4a during the production process of the subminiature lamp 1, the bulb 2 is mounted in the bulb holder 4 such that the lead wires 2a are in a straight line and pass through the slit 4a. The attachment of the bulb 2 within the bulb holder 4 is performed in accordance with the positions of the slit 4a and lead wires 2a.

There are several operational advantages associated with the subminiature lamp 1 according to the preferred embodiment of the present invention. First, the subminiature lamp 1 greatly improves productivity in manufacturing and assembling as compared to the conventional subminiature lamps 90 or 80, because the complications associated with pulling the lead wire 91a out from the bulb holder 93 or 83 through the through hole of the bottom of the bulb holder 93 or 83 are obviated. Furthermore, the process of winding the lead wire 2a around the end 95 of the socket base 94 is not required. After the bulb 2 is inserted, the lead wires 2a are bent along the predetermined passage on the top surface 5a. The lead wires 2a are attached to the guide ditch 5c formed on the end in the width direction L, and then the bulb 2 is fixed onto the socket base 5.

Figure 3:
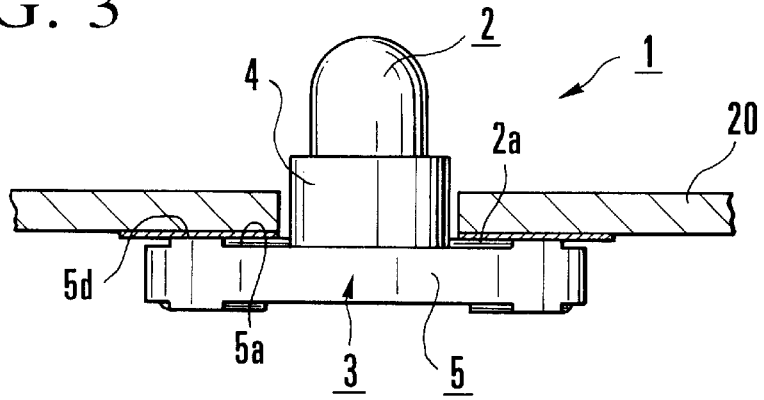
FIG. 3 is a diagram of the first preferred embodiment of the present invention showing an example when the first preferred embodiment is mounted on a printed wiring board.
Figure 4:
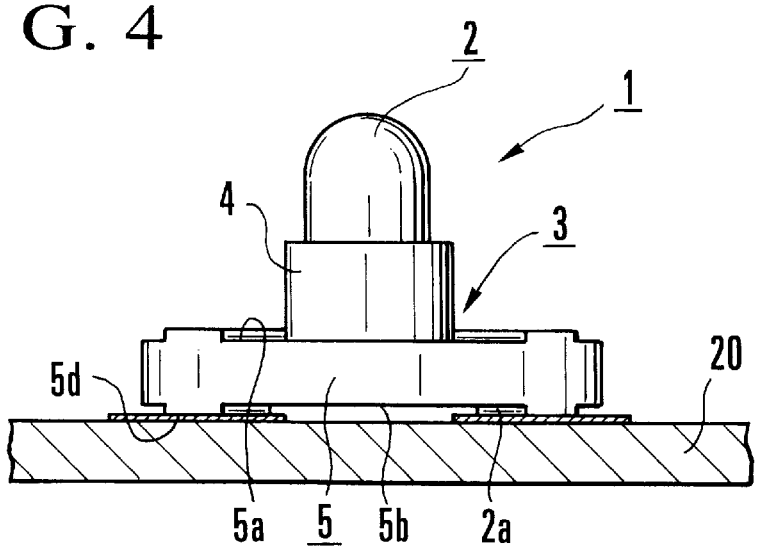
FIG. 4 is a diagram of the first preferred embodiment of the present invention showing another example when the first preferred embodiment is mounted on a printed wiring board.
Figure 5:
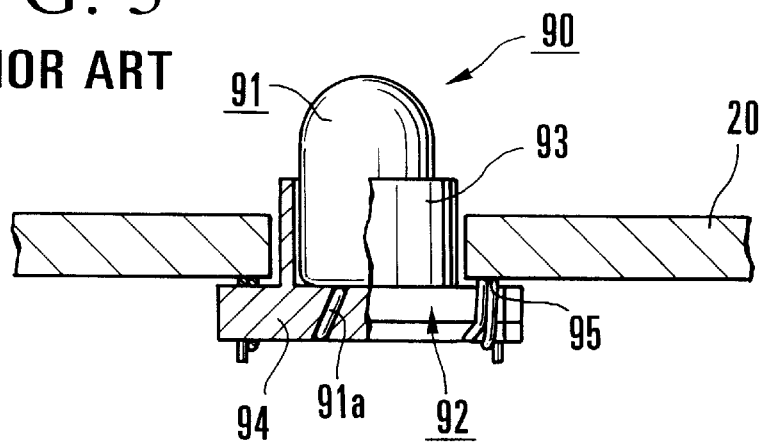
FIG. 5 is a diagram of a conventional subminiature lamp.
Figure 6:
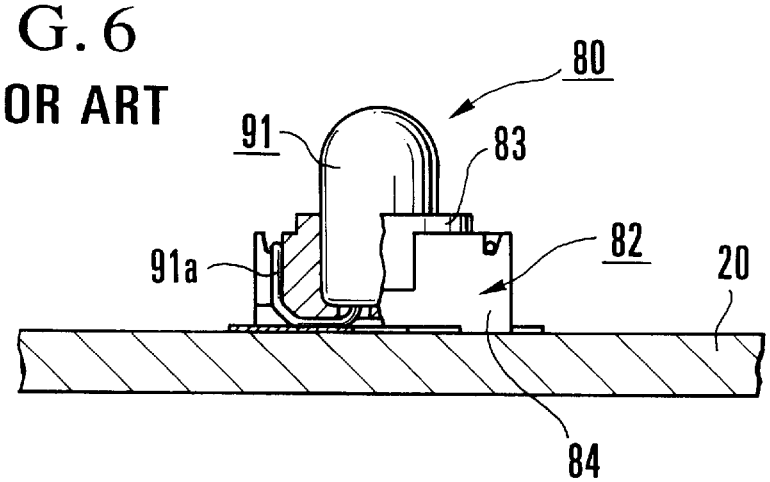
FIG. 6 is a diagram of another conventional subminiature lamp.

Second, since the socket 5 can be used for mounting the subminiature lamp 1 from both front and back surfaces of the printed wiring board 20, production efficiency is greatly improved. The same subminiature lamp 1 may be attached from the back surface of a printed wiring board 20 as shown in FIG. 3, or may be attached from the front surface of a printed wiring board 20 as shown in FIG. 4, because the front surface 5a and the back surface 5b are flat and parallel with each other and the lead wires 2a are wound along the surfaces 5a and 5b.

Third, when the bulb 2 is attached to the printed wiring board 20, the projections 5d makes a space between the surfaces 5a and 5b and printed wiring board 20. This prevents an inclined disposition of the subminiature lamp 1 to achieve more precise dimension control.

It will be apparent to those skilled in the art that various changes and modifications can be made therein without departing from the spirit and scope thereof. Thus, it is intended that the present invention cover the modifications and variations of the invention provided they come within the scope of the appended claims and their equivalents.

What is claimed is:

1. A subminiature lamp having a bulb with lead wires and a socket, the socket comprising:
   a socket base; and
   a bulb holder, connected to the socket base, for holding the bulb in a predetermined position, wherein
      a front surface and a back surface of the socket base form a substantially flat plate and are parallel with each other;
      the bulb holder is attached on the front surface of the socket base and the shape of the bulb holder is substantially a cylinder with a bottom corresponding to a portion of the front surface of the socket base; and
      a slit extends through the diameter of the bulb holder, wherein the lead wires extend through the slit of the bulb holder and are configured to be disposed along the front and back surface of the socket base.

2. The subminiature lamp of claim 1, further comprising at least one pair of projections formed on at least one surface of the socket base between which at least one of the lead wire passes.

3. The subminiature lamp of claim 1, further comprising at least two pairs of projections formed on at least one surface of the socket base between which at least one lead wire passes.

4. The subminiature lamp of claim 1, further comprising at least one pair of projections formed on the front and back surfaces of the socket base between which at least one lead wire passes.

5. The subminiature lamp of claim 1, wherein the socket base has at least one surface for attachment.

6. The subminiature lamp of claim 2, wherein the height of the projections substantially corresponds to the height of the lead wire disposed on the surface of the socket base.

7. The subminiature lamp of claim 1, wherein a guide ditch is formed in an end of the socket base to facilitate introduction of a lead wire from one surface of the socket base to another surface of the socket base.

8. The socket according to claim 5, wherein the top surface and bottom surface are capable of attachment to at least one object.

9. The socket according to claim 5, wherein the at least one lead wire is disposed along the top and bottom surfaces of the socket base.

* * * * *